United States Patent
Wan et al.

(10) Patent No.: US 8,629,466 B2
(45) Date of Patent: Jan. 14, 2014

(54) LIGHTING DEVICE

(75) Inventors: Shan Mei Wan, Hong Kong (HK); Tuen Yi Ng, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 0 days.

(21) Appl. No.: 13/477,064

(22) Filed: May 22, 2012

(65) Prior Publication Data

US 2013/0313580 A1 Nov. 28, 2013

(51) Int. Cl.
*H01L 33/00* (2010.01)

(52) U.S. Cl.
USPC .................................. 257/88; 257/89; 738/27

(58) Field of Classification Search
USPC .......... 257/88, 89, E33.066, E21.506; 438/27
See application file for complete search history.

(56) References Cited

U.S. PATENT DOCUMENTS

| | | | |
|---|---|---|---|
| 6,917,057 B2 * | 7/2005 | Stokes et al. .................... 257/98 |
| 7,750,362 B2 * | 7/2010 | Chang Chien et al. ......... 257/99 |
| 7,901,111 B2 * | 3/2011 | Negley et al. ................. 362/293 |
| 7,960,872 B1 * | 6/2011 | Zhai et al. ...................... 307/157 |
| 7,973,327 B2 * | 7/2011 | West ................................ 257/98 |
| 7,999,283 B2 * | 8/2011 | Chakraborty et al. ......... 257/100 |
| 8,042,971 B2 * | 10/2011 | Medendorp et al. ..... 362/249.06 |
| 8,258,693 B2 * | 9/2012 | Cok et al. ....................... 313/506 |
| 2008/0218993 A1 * | 9/2008 | Li ................................... 362/84 |
| 2011/0284822 A1 * | 11/2011 | Jung et al. ....................... 257/13 |
| 2012/0001204 A1 * | 1/2012 | Jagt ................................. 257/88 |

* cited by examiner

Primary Examiner — Theresa T Doan
(74) Attorney, Agent, or Firm — Ella Cheong Hong Kong; Sam T. Yip

(57) ABSTRACT

This invention discloses a lighting device for providing an illumination with enhanced color uniformity. The lighting device includes a light generating element adjacent a substrate and configured to produce light having wavelengths substantially within a first wavelength range; a transparent frame attached to the substrate, surrounding the transparent frame; a wavelength converting layer for converting a portion of the light produced by the light generating element into light having wavelengths within a second wavelength range, substantially covering the light emitting surface and at least part of the transparent frame; and a scattering frame configured to substantially scatter light that travels therein, covering a portion of the light emitting surface around periphery thereof to thereby receive a portion of the light leaving the wavelength converting layer around the periphery of the light emitting area. Light components in said portion of the light are substantially mixed in the scattering frame.

18 Claims, 4 Drawing Sheets

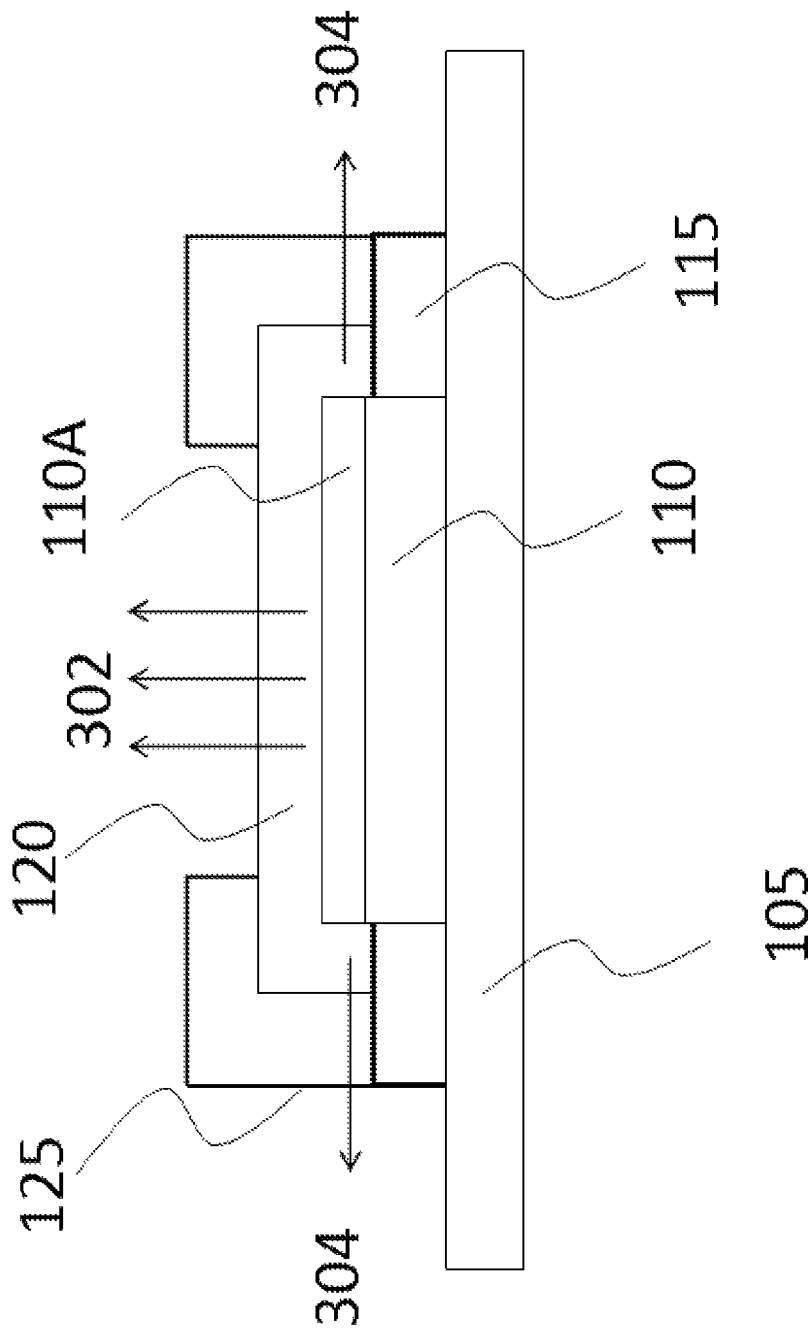

LIGHTING DEVICE

FIELD OF THE INVENTION

The present invention relates generally to a lighting device attached to a mounting substrate. Particularly, the present invention relates to a lighting device for providing an illumination with enhanced color uniformity in the light emanating from the device.

BACKGROUND

A lamp using a light emitting diode (LED) as a light source offers a number of advantages over conventional lamps such as an incandescent lamp, a halogen lamp and a fluorescent lamp. These advantages include longer lifetime and higher power-light conversion efficiency, as well as environmental friendliness in that mercury is absent in a LED lamp. Due to these advantages, LEDs have found many applications in lighting.

LEDs producing red, yellow, green or blue light are commonly available. These LEDs can be used in various applications such as in signpost displays and in traffic lights. In lighting applications used for illumination, e.g., illuminating a newspaper for reading, white light is preferred. Since white light has a broad range of wavelengths, and since light produced by a LED typically has a narrow range, an additional step is required to convert light produced by the LED into white light. A typical method is to employ a blue LED and a layer of phosphor that emits yellow fluorescent light when excited by a portion of the blue light produced by the blue LED. The mixing of the yellow fluorescent light and the remaining portion of the blue light yields the white light. However, there is often difficulty in mixing these two light components. Since the blue light produced by the blue LED is directional in general but the yellow fluorescent light is omnidirectional, there can be difficulty in mixing these two light components. It contributes to a result that when the white light is projected onto a white plane, the illuminated area appears to have an objectionable yellowish annular ring encircling the whiter area located at the center of the illuminated area. It results in perceivable non-uniformity of the color of the light emanating from the LED lighting device over the illuminated area.

The color of light is often measured in terms of "color temperature" The color temperature of the electromagnetic radiation emitted from an ideal black body is defined as its surface temperature in Kelvins, or alternatively in mired (micro-reciprocal Kelvins). Color temperature is used to compare light sources. However, since many light sources such as fluorescent sources and LEDs do not emit light by thermal radiation, the expression "correlated color temperature" is typically used to describe the "color temperature" for these light sources. It is based on human perception of the approximated "thermally radiated" color temperature. However, for convenience, the term "color temperature" as used herein refers to both actual color temperature and correlated color temperature.

The distribution of the color temperature can be made more uniform by means of complicated secondary optics, e.g., a textured reflector that is specially designed. While the manufacturing cost to produce a lighting device employing complicated secondary optics is increased, another disadvantage is that the lighting device cannot be miniaturized due to the presence of complicated secondary optics that are generally much larger than the LED. A lighting device that can be realized in small size without complicated secondary optics and that provides an illuminated area with perceived uniformity in color temperature is useful in many applications. Herein in the specification and in the appended claims, perceived uniformity in color temperature refers to a condition that an ordinary person perceives or subjectively feels that the color temperature (over an illuminated area) is sufficiently uniform. Although this can be quantitatively measured, lighting manufacturers sometimes rely on subjective observer evaluation. Further, as LED lighting fixtures are often designed to replace incandescent lighting fixtures, manufacturers often desire to replicate the emission of an incandescent bulb in creating a light source that is pleasing to consumers.

U.S. Pat. No. 7,973,327, discloses an arrangement in which a scattering ring is positioned to surround lateral surfaces of a LED such that a portion of light emitted from the LED through these lateral surfaces is scattered into a phosphor layer located on both the scattering ring and the LED. It is thought that due to scattering, the blue light emitted from the LED via lateral surfaces becomes much less directional when entering the phosphor layer, thereby promoting mixing between the yellow fluorescent light and the blue scattered light that is survived without being converted into fluorescent light. However, the inventors of the present invention determined that while the perceived uniformity in color temperature of the illuminated area was improved, the optical loss as a result of the addition of the aforesaid arrangement was as high as 10% to 20%.

In U.S. Pat. No. 6,917,057, it is mentioned that the spatial distribution of phosphor particles in a phosphor layer atop a LED is not uniform due to a step change in height at the periphery of the LED, causing uneven deposition of the phosphor particles over the phosphor layer during fabrication. It is disclosed in U.S. Pat. No. 6,917,057 that an arrangement of a substantially transparent, substantially phosphor-free layer of height at least one quarter of a height of the LED can first be deposited to surround the LED, so that the step change in height is reduced. The phosphor layer can then be deposited on top of the LED and the substantially transparent, substantially phosphor-free layer. However, it was determined that whereas the optical loss due to including the aforesaid arrangement could be maintained to be less than 7%, the non-uniformity of color temperature was unacceptably perceivable to viewers.

U.S. Pat. No. 7,999,283 discloses a light emitting device having an encapsulant with light scattering materials therein, and with scattering features to tailor the spatial emission pattern and color temperature uniformity of output light. The scattering features are tailored by spatially varying the concentration of light scattering materials. Although it is expected that the optical loss can be kept in a satisfactory value and the uniformity of color temperature can be made perceptually acceptable, a disadvantage is the fabrication complexity involved in the deposition of the encapsulant, thus leading to a high manufacturing cost.

There is a need in the art for a lighting device that provides an illumination with perceived color uniformity in the light emanating from the device without leading to a substantial optical loss, and that can be realized in small size and without involving substantial fabrication complexity.

SUMMARY OF THE INVENTION

The present invention discloses a lighting device that is attached to a mounting substrate. The lighting device comprises a light generating element configured to produce light having wavelengths substantially within a first wavelength range. The light generating element has: a light emitting surface, from which a substantial portion of the light produced by the light generating element is allowed to emit; a base surface opposite to the light emitting surface and attached to the mounting substrate; and a lateral surface linking the base surface and the light emitting surface. The lighting device further comprises a transparent frame attached to the mounting substrate and the lateral surface without substantially covering the light emitting surface, thereby causing the light generating element to be surrounded by the transparent frame. A wavelength converting layer for converting a portion of the light produced by the light generating element into light having wavelengths within a second wavelength range is also included in the lighting device. In addition, the wavelength converting layer substantially covers the light emitting surface and at least part of the transparent frame to thereby capture the substantial portion of the light produced by the light generating element. It follows that light leaving the wavelength converting layer comprises a first light component and a second light component in which the first light component contains light having wavelengths substantially within the first wavelength range and the second light component contains light having wavelengths within the second wavelength range. The lighting device further comprises a scattering frame configured to substantially scatter light that travels therethrough. The scattering frame covers a portion of the wavelength converting layer around a top and edge periphery thereof. Thereby, the scattering frame receives a portion of the light leaving the wavelength converting layer around the periphery of the light emitting area. The first light component and the second light component in said portion of the light are substantially mixed in the scattering frame.

Preferably the scattering frame is configured such that at least approximately 10% of the light from wavelength converting layer surface enters the frame. It is also preferable that the scattering frame includes a plurality of light scattering agents for substantially scattering the light that travels therein. The plurality of light scattering agents may be substantially composed of an organic material or an inorganic material. Each of the light scattering agents may have a shape substantially similar to a sphere or an ellipsoid. In addition, a bulk of the scattering frame may be substantially composed of an organic material or an inorganic material.

The light generating element may be a LED or an organic LED (OLED), or may be substantially composed of a semiconductor material. The first wavelength range may be contiguous or non-contiguous. In the latter case, the first wavelength range comprises a plurality of sub-ranges.

The transparent frame may be substantially composed of an organic material or an inorganic material.

Preferably the wavelength converting layer includes at least one kind of photo-luminescent agent for converting the portion of the light produced by the light generating element into the light having wavelengths within the second wavelength range. The photo-luminescent agents may be phosphor particles. However, any material capable of light conversion may be used in this layer. A bulk of the wavelength converting layer may be substantially composed of an organic material or an inorganic material.

A lighting apparatus may be formed by comprising a mounting substrate, and the disclosed lighting device attached to the mounting substrate. Alternatively, a lighting apparatus may be obtained by comprising a mounting substrate, and a plurality of the disclosed lighting devices attached to the mounting substrate. A lighting apparatus may also be realized by comprising a mounting substrate and at least one such disclosed lighting device, where such disclosed lighting device is attached to the mounting substrate.

BRIEF DESCRIPTION OF THE DRAWINGS

FIG. 1 depicts an exemplary embodiment of a lighting device disclosed in the present invention, in which

FIG. 3 depicts a further embodiment of the lighting device of the present invention.

DETAILED DESCRIPTION

The present invention discloses a lighting device for providing an illumination with enhanced color uniformity in the light emanating from the device without leading to a substantial optical loss, with further advantages that the lighting device can be realized in small size and can be fabricated without substantial complexity.

Figure 1A:
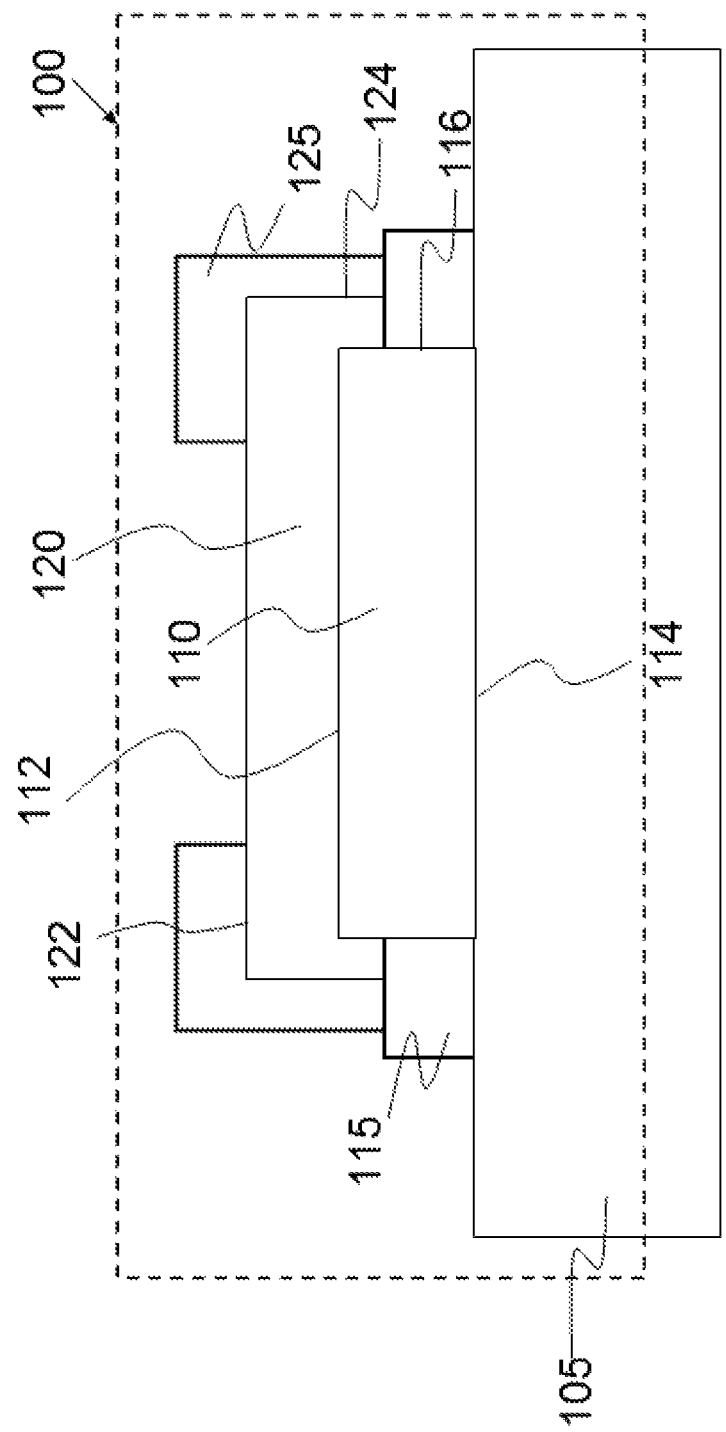
FIG. 1a is a side view and FIG. 1b is a top view.
Figure 1B:
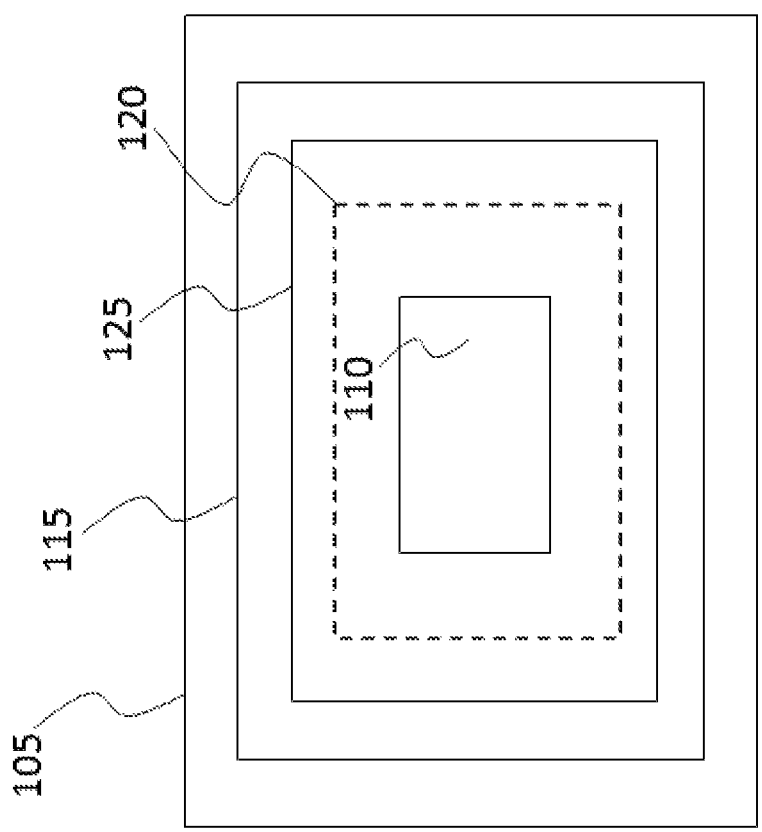

An exemplary embodiment of the lighting device disclosed in the present invention is depicted in FIG. 1, in which a side view and a top view of the lighting device are given in FIG. 1a and FIG. 1b, respectively. For simplicity in illustration, FIG. 1a and FIG. 1b do not depict electrical wires or other electrical connectors, which are necessary to provide electrical power to the lighting device for generating light.

A lighting device 100 is attached to a mounting substrate 105. The mounting substrate 105 may provide one or more of the functions including: a mechanical support to the lighting device 100; an electrical pathway for providing electric power to the lighting device 100; a heat dissipation path for heat generated by the lighting device 100 when powered on; and a reflector for reflecting back light produced by the lighting device 100 and impinged on the mounting substrate 105. An example of the mounting substrate is an aluminum sheet although other materials can also be selected.

The lighting device 100 comprises a light generating element 110 configured to produce light having one or more wavelengths substantially within a first wavelength range. Herein in the specification and in the appended claims, a light generating element refers to a device that can emit light. Examples of the light generating element 110 include LED, OLED, any semiconductor-based light source, or a plurality thereof. In addition, one particular example of the light generating element 110 is a blue LED, which can be used to produce white light as mentioned above. Although the light generating element 110 shown in FIG. 1b is drawn in a shape of a rectangular volume, it is for the purpose of illustration simplicity. The light generating element 110 is not limited to this rectangular shape. An example of other shape of the light generating element 110 is a cylinder. A wavelength range as described herein in the specification and in the appended claims can be contiguous or non-contiguous. An example of the light generating element 110 that produces a contiguous wavelength range is an LED, while an example that generates a non-contiguous wavelength range is a light source consisting of two LEDs, the wavelengths of light produced by both of which do not overlap. For a non-contiguous wavelength range, it comprises a plurality of sub-ranges. The light generating element 110 has: (1) a light emitting surface 112, from which a substantial portion of the light produced by the light generating element 110 is allowed to emit; (2) a base surface 114, which is opposite to the light emitting surface and attached to the mounting substrate 105; and (3) a lateral surface 116 linking between the base surface and the light emitting surface. Herein in the specification and in the appended claims, a lateral surface of a light generating element is an entirety of one or more surfaces connecting between a light emitting surface and a base surface both of the light generating element. For the light generating element 110 shown in FIG. 1a and FIG. 1b, the lateral surface consists of four surfaces 116 linking the light emitting surface and the base surface. However, it is understood that surface 116 can be of any arbitrary shape depending upon the selection of light generating element 110 and that the depiction of geometries in the FIGS. is purely schematic to illustrate the relative position of components and does not depict actual size or shape of the components.

The lighting device 100 further comprises a transparent frame 115 attached to the mounting substrate 105 and the lateral surface without substantially covering the light emitting surface. This arrangement for the transparent frame 115 causes the light generating element 110 to be surrounded by the transparent frame 115. Preferably, the transparent frame 115 is substantially composed of an organic material or an inorganic material. One example of a material for forming the transparent frame 115 is silicone resin; epoxy resins can also be selected.

A wavelength conversion layer 120 is further included in the lighting device 100 for converting a portion of the light produced by the light generating element 110 into light having wavelengths within a second wavelength range. In addition, the wavelength converting layer 120 substantially covers the light emitting surface 112 and at least part of the transparent frame 115 to thereby capture the substantial portion of the light produced by the light generating element 110. It follows that light leaving the wavelength converting layer 120 comprises a first light component and a second light component in which the first light component contains light having wavelengths substantially within the first wavelength range and the second light component contains light having wavelengths within the second wavelength range. In one particular embodiment, the second light component is yellow light that is wavelength-converted from a portion of blue light generated by a blue LED realized as the light generating element 110, and the first light component is a remaining portion of the blue light that survived without being converted into the yellow light. Preferably the wavelength converting layer 120 includes at least one kind of photo-luminescent agent for converting the portion of the light produced by the light generating element 110 into the light having wavelengths within the second wavelength range. The wavelength conversion layer 120 may be realized as a phosphor layer containing one or more kinds of phosphor particles as the photo-luminescent agents. The phosphor particles convert light from the first wavelength range into the second wavelength range by fluorescence. The resultant wavelength-converted light emitted by fluorescence is omnidirectional. Different kinds of phosphor particles that are relevant to lighting applications are provided by Shionoya, S., Yen, W. M., and Yamamoto, H. (2006), *Phosphor Handbook*, CRC Press, the disclosure of which is incorporated by reference herein. Apart from the photo-luminescent agents, a bulk of the wavelength converting layer 120 may be substantially composed of an organic material or an inorganic material. An example of a material for forming the bulk of the wavelength converting layer 120 is silicone resin.

The lighting device 100 further comprises a scattering frame 125 configured to substantially scatter light that travels therein. In addition, the scattering frame 125 is positioned over the wavelength converting layer 120 on a top periphery portion 122 and edge portion 124 thereof such that it primarily captures light emitted from peripheral regions of emitter 110. By means of scattering, the first light component and the second light component in said portion of the light can be substantially mixed in the scattering frame 125. Thus, the addition of the scattering frame 125 increases the color uniformity of light emanating from the device. Consequently there is a perceived increase in the uniformity of color temperature over an illuminated area. One possible explanation for the increased uniformity is that light leaving the scattering frame 125 contributes a substantial amount of light that illuminates a periphery of the illuminated area; peripheral illuminated regions in prior art devices often have quite visible color differences from a central illuminated area.

Preferably at least 10% of the light exiting the light emitting surface is captured by the scattering frame 125, such that color uniformity is increased and a perceived uniformity in color temperature of an illuminated area can be achieved while a small optical loss of below 7% can be maintained. It has also been determined that when the light emitting surface was entirely covered by the scattering frame 125, a more uniform color distribution of the light over the illuminated area was achieved when compared to a case of partially covering the light emitting area by the scattering frame 125, but a substantial optical loss of over 20% was obtained. The presence of the transparent frame 115 appears to contribute to a reduction in optical loss experienced by the lighting device 100 in that light directed from the scattering frame 125 into the transparent frame 115 due to scattering can travel through the transparent frame 115 without further scattering (which could otherwise result in attenuation) to the outside of the lighting device 100.

Preferably the scattering frame 125 includes a plurality of light scattering agents for substantially scattering the light that travels therethrough. The plurality of light scattering agents may be substantially composed of an organic material or an inorganic material or a mixture thereof. Each of the light scattering agents may have a shape substantially similar to a sphere or an ellipsoid. As an example, the light scattering agents can be fine particles of aluminum oxide.

A bulk of the scattering frame 125 may be substantially composed of an organic material or an inorganic material. An example of a material for forming the bulk of the scattering frame 125 is silicone resin.

Based on the lighting device 100, a lighting apparatus may be formed by having the lighting device 100 attached to or mounted on a mounting substrate.

Figure 2:
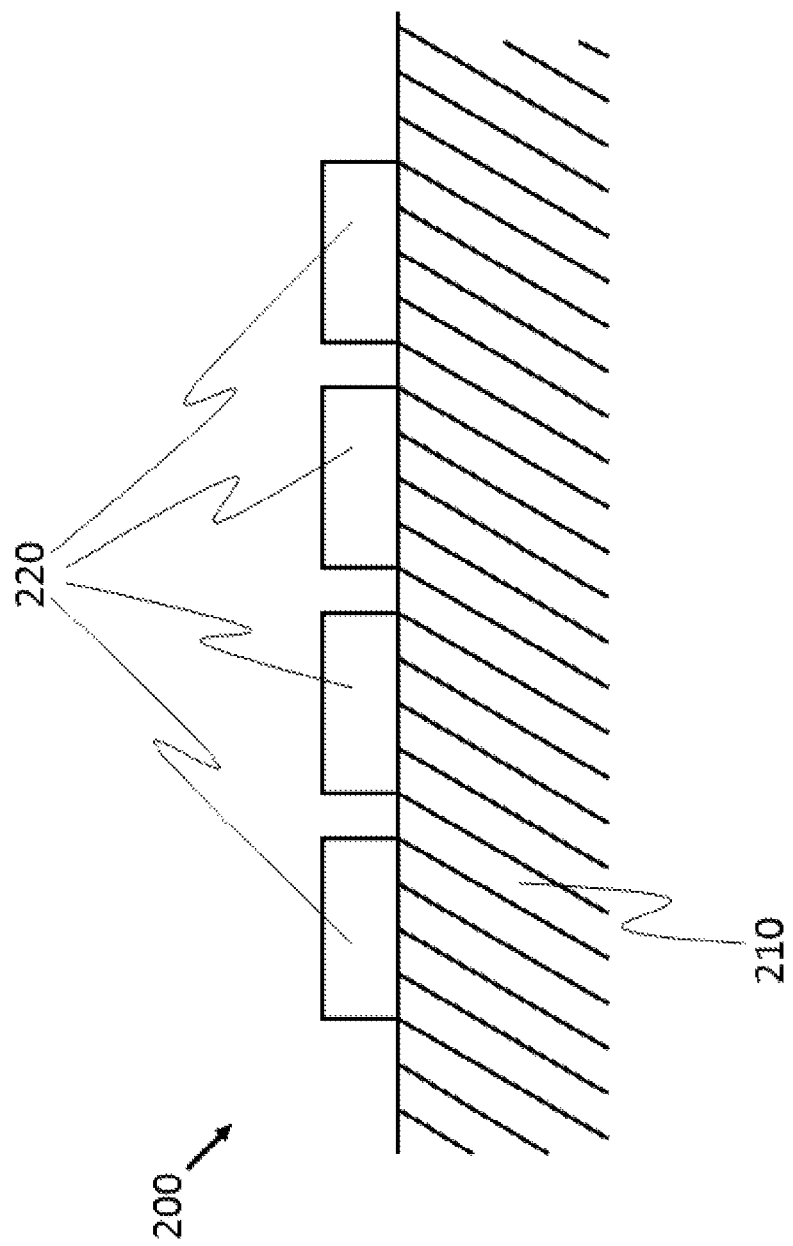
FIG. 2 is an embodiment of a lighting apparatus comprising one or more lighting devices disclosed in the present invention.

Alternatively, a lighting apparatus may be formed by including a plurality of lighting devices rather than just one lighting device. For illustration, such lighting apparatus is shown in FIG. 2. A lighting apparatus 200 comprises a plurality of lighting devices 220, all of the lighting devices 220 being attached to a mounting substrate 210. In one embodiment, each of the lighting devices 220 is the lighting device 100 disclosed herein. In another embodiment, at least one of the lighting devices 220 is the lighting device 100.

In one aspect of the invention depicted in FIG. 3, wavelength converting layer 120 is positioned such that it covers a side portion of light generating element 110. Light generating element 110 includes a light emitting region 110A. As seen in FIG. 3, a substantial portion of the light, 302, is emitted from the top of 110A; however, light is also emitted from the side of light emitting region 110A as shown by arrows 304. To ensure that the side-emitted light undergoes wavelength conversion, wavelength converting layer 120 extends over the side region of light emitting region 110A. Side-emitted light passing through the wavelength converting layer 120, passes into scattering ring 125. Note that the transparent ring 115 does not extend into the edge of region 110A to enable the side emitted light to enter wavelength converting layer 120.

The present invention may be embodied in other specific forms without departing from the spirit or essential characteristics thereof. The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A lighting device to produce light having enhanced color uniformity, the lighting device comprising:
    a light generating element configured to produce light having wavelengths substantially within a first wavelength range, wherein the light generating element has:
        (a) a light emitting surface, which emits a substantial portion of the light produced by the light generating element;
        (b) a base surface adjacent a substrate; and
        (c) a lateral surface linking the base surface and the light emitting surface;
    a transparent frame positioned over the substrate and the lateral surface without substantially covering the light emitting surface, thereby causing the light generating element to be surrounded by the transparent frame;
    a wavelength converting layer for converting a portion of the light produced by the light generating element into light having wavelengths within a second wavelength range, whereby light leaving the wavelength converting layer comprises a first light component and a second light component in which the first light component contains light having wavelengths substantially within the first wavelength range and the second light component contains light having wavelengths within the second wavelength range, wherein the wavelength converting layer substantially covers the light emitting surface and at least part of the transparent frame to thereby capture a substantial portion of the light produced by the light generating element; and
    a scattering frame configured to substantially scatter light that travels therethrough, the scattering frame covering a portion of the wavelength converting layer around a top and edge periphery thereof to thereby receive a portion of the light leaving the wavelength converting layer where said portion of the light leaves the wavelength converting layer adjacent a periphery of the light emitting area, whereby the first light component and the second light component in said portion of the light are substantially mixed in the scattering frame to produce light output having enhanced color uniformity.

2. The lighting device of claim 1, wherein the scattering frame is configured to capture at least 10% of the light exiting the wavelength converting layer surface.

3. The lighting device of claim 1, wherein the scattering frame includes a plurality of light scattering agents for substantially scattering the light that travels therein.

4. The lighting device of claim 3, wherein the plurality of light scattering agents is substantially composed of an organic material or an inorganic material.

5. The lighting device of claim 3, wherein each of the light scattering agents has a shape substantially similar to a sphere or an ellipsoid.

6. The lighting device of claim 3, wherein a bulk of the scattering frame is substantially composed of an organic material or an inorganic material.

7. The lighting device of claim 1, wherein the light generating element is a LED or an OLED.

8. The lighting device of claim 1, wherein the light generating element includes a light emitting surface region and the wavelength converting layer is positioned to cover top and side portions of the light emitting surface region.

9. The lighting device of claim 1, wherein the light generating element is substantially composed of a semiconductor material.

10. The lighting device of claim 1, wherein the first wavelength range is contiguous.

11. The lighting device of claim 1, wherein the first wavelength range is non-contiguous and comprises a plurality of sub-ranges.

12. The lighting device of claim 1, wherein the transparent frame is substantially composed of an organic material or an inorganic material.

13. The lighting device of claim 1, wherein the wavelength converting layer includes at least one kind of photo-luminescent agents for converting the portion of the light produced by the light generating element into the light having wavelengths within the second wavelength range.

14. The lighting device of claim 13, wherein the photo-luminescent agents are phosphor particles.

15. The lighting device of claim 13, wherein a bulk of the wavelength converting layer is substantially composed of an organic material or an inorganic material.

16. A lighting apparatus comprising:
    a mounting substrate; and
    the lighting device of claim 1, wherein the lighting device is attached to the mounting substrate.

17. A lighting apparatus comprising:
    a mounting substrate; and
    a plurality of the lighting devices of claim 1, each of the lighting devices being attached to the mounting substrate.

18. A lighting apparatus comprising:
    a mounting substrate; and
    at least one lighting device, wherein the one lighting device is the lighting device of claim 1 and is attached to the mounting substrate.

* * * * *